United States Patent [19]

Foster et al.

[11] Patent Number: 4,557,950
[45] Date of Patent: Dec. 10, 1985

[54] PROCESS FOR DEPOSITION OF BOROPHOSPHOSILICATE GLASS

[75] Inventors: Thomas C. Foster, Sunnymead; Jon C. Goldman, Orange; Gary W. Hoeye, Santa Ana, all of Calif.

[73] Assignee: Thermco Systems, Inc., Orange, Calif.

[21] Appl. No.: 611,793

[22] Filed: May 18, 1984

[51] Int. Cl.$^4$ .................. C23C 11/00; C23C 13/00
[52] U.S. Cl. ........................ 427/255; 427/85; 427/95; 427/99; 427/255.3; 427/314
[58] Field of Search ............ 427/255, 255.3, 314, 427/87, 85, 93, 95, 99, 397.7; 106/287.1; 423/324

[56] References Cited

U.S. PATENT DOCUMENTS

| | | | |
|---|---|---|---|
| 3,481,781 | 12/1969 | Kern | 427/255.3 |
| 4,098,923 | 7/1978 | Alberti et al. | 427/255 |
| 4,191,603 | 3/1980 | Garbarino et al. | 427/95 |
| 4,253,417 | 3/1981 | Valentijn | 118/733 |
| 4,369,031 | 1/1983 | Goldman et al. | 118/724 |
| 4,376,796 | 3/1983 | Arrasmith et al. | 427/95 |
| 4,394,401 | 7/1983 | Shioya et al. | 427/95 |
| 4,409,424 | 10/1983 | Devaud | 136/258 |
| 4,433,008 | 2/1984 | Schnable et al. | 427/95 |

OTHER PUBLICATIONS

Kern et al., "Chemically Vapor-Deposited Borophosphosilicate Glasses for Silicon Device Applications", RCA Review, vol. 43, pp. 423–457, Sep. 1982.

*Primary Examiner*—Sadie L. Childs
*Attorney, Agent, or Firm*—John K. Williamson; James C. Valentine

[57] ABSTRACT

A process for chemical vapor deposition of borophosphosilicate glass on a silicon wafer at reduced pressure is disclosed herein. The process includes a step of placing a silicon wafer within a reactor tube. The reactor tube is evacuated to a pressure of less than 500 millitorr and is heated to a temperature of not less than 350° C. and not greater than 500° C. A mixture of silane, phosphine and boron trichloride gases is flowed into the reactor tube so that the mixture contacts the silicon wafer. At the same time, a quantity of oxygen is flowed into the reactor tube so that the oxygen also contacts the silicon wafer and intermixes and reacts with the silane, phosphine and boron trichloride gases to form layers of borophosphosilicate glass on the silicon wafer.

14 Claims, 4 Drawing Figures

PROCESS FOR DEPOSITION OF BOROPHOSPHOSILICATE GLASS

BACKGROUND OF THE INVENTION

It is well known in the prior art to employ silicon dioxide ($SiO_2$) on silicon wafers as a diffusion mask, to protect diffused junctions from impurity contamination, as a surface insulator to separate various devices and metal interconnections, or as a dielectric film for capacitors. The masking properties of $SiO_2$ are particularly important to prevent positively charged ions, such as $Na^+$ or $H^+$, which have relatively large diffusion coefficients in $SiO_2$ at low temperatures, from entering the doped areas of the wafer which the $SiO_2$ masks since the sodium and hydrogen ions can be especially detrimental to integrated circuit devices containing lightly doped p-type regions.

$SiO_2$ can be formed by thermal oxidation of silicon wafers in a diffusion furnace at temperatures between 900° and 1200° Centigrade. Thermal oxidation is carried out by contacting silicon on the wafer surfaces with oxygen or steam. However, the high temperatures required for the growth of thermal oxides can often lead to redistribution of the previously diffused impurity layers. In order to avoid the dopant redistribution, low temperature deposited oxide processes which, for instance, employ the pyrolytic decomposition of tetraethylorthosilicate (TEOS) or which employ vapor phase reactions such as the reaction between silane ($SiH_4$) and oxygen are desirable since they can typically be run at temperatures of 400° to 500° Centigrade. Such pyrolytic deposition of $SiO_2$ or silicate glass sometimes referred to as s-glass, can also be used to form a protective dielectric coating over the entire integrated circuit surface after the metal interconnections have been formed.

A typical apparatus for the formation of thermal oxides on silicon wafers is disclosed in U.S. Pat. No. 4,253.417 to Valentijn for CLOSURE FOR THERMAL REACTOR, which is assigned to the assignee of the present application. An improvement to prevent stratification of gases within a high pressure oxidation system is disclosed in U.S. Pat. No. 4,376,796 to Arrasmith et al. for PROCESSING SILICON WAFERS EMPLOYING PROCESSING GAS ATMOSPHERES OF SIMILAR MOLECULAR WEIGHT, which is assigned to the assignee of the present application. A typical system for the formation of deposited oxides on silicon wafers is disclosed in U.S. Pat. No. 4,369,031 to Goldman et al. for GAS CONTROL SYSTEM FOR CHEMICAL VAPOR DEPOSITION SYSTEM which is assigned to the assignee of the instant invention.

In addition, it has been found that it is often important to provide a very uniform deposited oxide coating on the silicon wafers. In order to achieve this, the wafers are often enclosed within a shrouded boat during deposition, as is disclosed in U.S. Pat. No. 4,098,923 to Alberti, et al. for PYROLYTIC DEPOSITION OF SILICON DIOXIDE ON SEMICONDUCTORS USING A SHROUDED BOAT. Alberti, et al. teaches a deposited oxide system which employs oxygen, silane and phosphine as the reactants to deposit a phosphosilicate glass. The deposition process takes place at a pressure of less than 50 microns and at a deposition rate of 100 Angstroms per minute.

Phosphosilicate or phosphorus doped glass is employed as a flow glass layer in the production of semiconductors. In other words, it comprises an inert insulating layer which, when deposited, assumes the contours of the surface upon which it is deposited. Since it is well known that integrated circuits often have a terraced surface contour due to previous deposition and etching steps and that metal interconnects are often formed on the top of such a deposited glass layer, it is desirable to flow or slightly soften the glass in an additional flow step wherein the silicon wafers are subjected to an elevated temperature in order to soften the contours of the glass. If such a flow step is not performed and aluminum interconnect layers are formed directly on the deposited glass layer, there can be failures of the metal interconnects at places where the slope of the glass layer changes abruptly due to the fact that microcracks are formed which can, at the least, raise the resistance of the metal interconnects, or even sever the connection completely. As the geometries of the integrated circuits formed on wafers have reduced, it has become more and more difficult to provide a glass coating having flow characteristics which are compatible with other process steps in order to minimize redistribution of dopants during flow annealing.

The temperature at which the glass softens is determined by the concentration of phosphorus within the glass. Thus, as the concentration of phosphorus is increased, the glass has a tendency to soften at lower temperatures. However, the concentration of phosphorus does have an upper limit, due to the fact that phosphorus atoms can diffuse out of the glass and into the doped portions of the wafers causing changes in the doping concentration and degraded performance or cause failure of the integrated circuit. In addition, the phosphorus in glass is hygroscopic. Its tendency to attract moisture can lead to the formation of phosphoric acid within the glass layer which can damage metal interconnects in contact with the glass.

As an alternative, boron doped glasses have also been employed to lower the flow temperature so that redistribution of dopants does not take place during the flow reheating step. Most recently the art has advanced to the point that a combination of phosphorus and boron included in the glass layer provides low flow temperatures and provides a combination which prevents phosphorus contamination problems and the tendency of the glass layer to absorb water and generate phosphoric acid within itself. Typical of prior art processes for forming borophosphosilicate glass is U.S. Pat. No. 3,481,781 to Kern for SILICATE GLASS COATING OF SEMICONDUCTOR DEVICES. An article entitled "Chemical Vapor-Deposited Borophosphate Glass for Silicon Device Applications" by W. Kern and G. Schnable, published in Volume 43, *RCA Review*, September, 1982, indicates the importance of the use of borophosphosilicate glass films to provide adequately tapered contours over steep steps of oxide and polycrystalline silicon in order to insure the continuity and maintenance of film thickness of subsequently deposited metal conductor interconnect lines. That article teaches the use of chemical vapor deposition employing silane, diborane ($B_2H_6$) and phosphine ($PH_3$) with oxygen. The article further states that certain rotary batch reactors, continuous oxide deposition reactors and continuous reactors are commercially available for carrying out the disclosed process.

Applicants, in experimenting with the chemical vapor deposition of borophosphosilicate glasses, particularly at low temperatures, employing deposited oxide systems having injector manifolds extending along the length of the process tube of the type disclosed in U.S. Pat. No. 4,369,031, have found that atmospheric pressure chemical vapor deposition systems do not provide the uniformity of film thickness, and the low rates of particle and pinhole formation in the $SiO_2$ layer which are required of deposited oxide layers by the wafer fabrication industry. In addition, the prior art atmospheric pressure systems appear to produce oxide layers having nonuniform step coverage which causes the process run in an atmospheric pressure system to be nonrepeatable and unreliable.

When applicants began experimenting with reduced pressure, or low pressure injector type CVD systems employing silane, oxygen, phosphine and diborane as reactants, they found that very little boron was included within the deposited glass layer, the diborane apparently, almost completely dissociating within the injector manifold thereby depositing most of the boron within the injector tubes, and depleting the source of boron before it reached the vicinity of the wafers.

What is needed, then, is a low pressure chemical vapor deposition system for depositing deposited glass thin films of borophosphosilicate glass on silicon wafers, the thin films having low flow temperatures, adequate inclusion of boron, good step coverage and few pinholes.

SUMMARY OF THE INVENTION

The invention is directed to a process whereby layers of borophosphosilicate glass are deposited at low pressure on a plurality of silicon wafers located within a process tube. The process consists of a step of placing a plurality of wafers in a shrouded quartz boat or wafer carrier having a plurality of slots cut in the walls thereof to admit reactant gases to the vicinity of the wafers. The shrouded boats are then loaded within an elongated, cylindrical quartz hot wall reactor tube which is operating at a temperatute not less than 350° C. and not more than 500° C. and preferably about 425° C. The reactor tube is then closed and flushed out with dry nitrogen. The pressure in the tube is then reduced to below 500 millitorr but not less than 150 millitorr. Preferably, the tube pressure is held at 175 millitorr to 200 millitorr during deposition of the borophosphosilicate glass film. A mixture of silane, phosphine and boron trichloride ($BCl_3$) is flowed into the reactor tube through a first pair of silane injectors. Oxygen is also flowed into the tube through a pair of oxygen injectors. The pressure of the tube is maintained at 175 to 200 millitorr while the reactant gases are flowed in. The flow of reactant gases is maintained and the temperature of 425° C. is maintained until a desired thickness of borophosphosilicate glass is formed on the wafer. The flows of all of the reactant gases are then terminated and the tube is flushed out with dry nitrogen flowed into it through one of the injectors. The wafers are then removed from the reactor tube and further processing is performed upon them.

A principal object of the present invention is to provide a process for low pressure chemical vapor deposition of low flow temperature borophosphosilicate glass on silicon wafers.

It is a further object of the present invention to provide a process for low pressure chemical vapor deposition of borophosphosilicate glass wherein the deposited glass film has good step coverage and very few pinholes.

It is another object of the present invention to provide a process for low pressure chemical vapor deposition of borophosphosilicate glass wherein adequate concentrations of boron can be included in the deposited glass layer without most of the boron being depleted prior to reaching the silicon wafers.

Other objects of the present invention will become obvious to one skilled in the art on perusal of the specification and claims in light of the accompanying drawings.

DESCRIPTION OF THE PREFERRED EMBODIMENT

Figure 1:
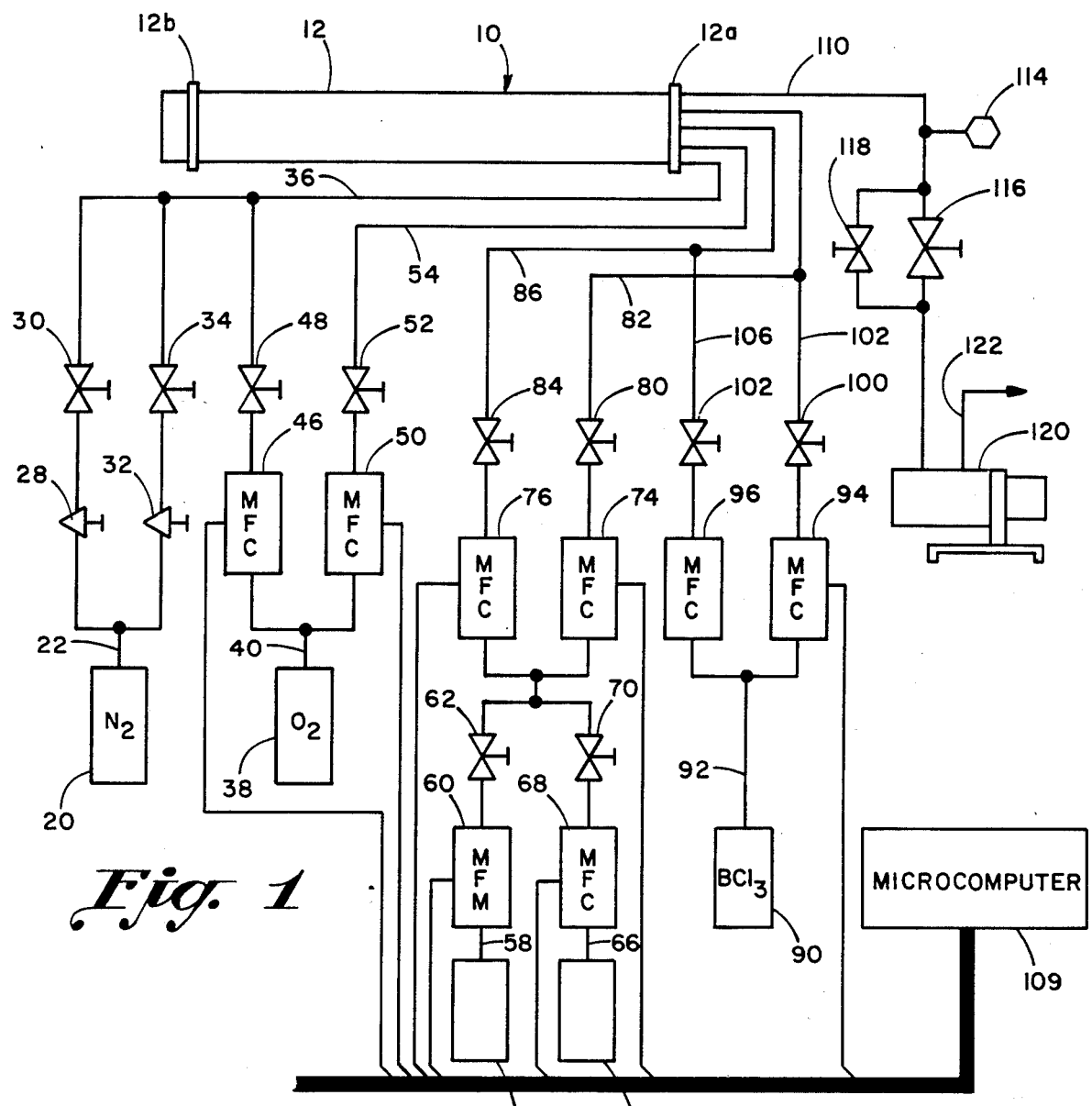
FIG. 1 is a schematic diagram of an apparatus adapted to perform the invention deposition process.

Referring now to the drawings, and especially to FIG. 1, an apparatus for performing the disclosed inventive process is designated generally by reference numeral 10. An elongated, cylindrical quartz process tube 12, having a source end 12a and a load end 12b, of a conventional type is seated within an electrical resistance heating element 24 and is adapted to receive a shrouded boat containing a plurality of wafers to be processed as will become apparent hereinafter. The process tube 12 is adapted to receive a plurality of reactant gases and to be evacuated by a vacuum pump.

A source 20 of pressurized dry nitrogen gas is connected to a nitrogen gas feed line 22 which is connected through a pair of branch lines 24 and 26 to a low flow rate nitrogen needle valve 28, a low flow rate nitrogen valve 30, a high flow rate nitrogen needle valve 32 and a high flow rate nitrogen valve 34. The low and high flow rate nitrogen valves 30 and 34 are connected to an oxygen load feed line 36.

A source of oxygen 38 is connected through a second oxygen feed line 40 to a pair of lines 42 and 44. The line 42 is connected to a load oxygen mass flow controller 46 which is, in turn, connected to a valve 48. A source oxygen mass flow controller 50 is connected to the line 44 to receive oxygen therefrom and to control the flow of oxygen through a valve 52 and to an oxygen source delivery line 54. Oxygen line 36 also comprises an oxygen load delivery line.

A source of silane 56 is connected through a line 58 to a silane mass flow meter 60 which is connected to a valve 62. A source of phosphine gas 64 is connected through a phosphine line 66 to a phosphine mass flow controller 68. The phosphine mass flow controller 68 feeds a valve 70. The silane valve 62 and the phosphine valve 70 are connected to a mixing line 72 which is, in turn, connected to a silane-phosphine load mass flow controller 74 and a silane-phosphine source mass flow controller 76 connected in parallel with silane-phosphine load mass flow controller 74. The silane-phosphine load mass flow controller 74 delivers its silane and phosphine through a silane load control valve 80 to a silane load flow line 82. The silane-phosphine source flow controller 76 delivers its output through a silane-phosphine source valve 84 to a silane-phosphine source feed line 86.

A source of boron trichloride 90 is connected by a boron trichloride feed line 92 to a load boron trichloride mass flow controller 94. The boron trichloride feed line 92 is also connected to a source boron trichloride flow mass controller 96. The load flow controller 94 supplies a load boron trichloride flow stream to a valve 100. The source boron trichloride flow controller 96 supplies a source boron trichloride flow stream to a valve 102. The load boron trichloride flow stream is combined with the load silane-phosphine flow stream at a junction between a load boron trichloride flow line 104 and the silane-phosphine flow load line 82. A source boron trichloride flow stream flowing through a line 106 is combined with the source silane-phosphine flow stream from line 86 and is piped into the process tube 12. Each of the mass flow controllers 46,50,68,74,76,94 and 96 and the mass flow meter 60 are connected to a microcomputer 109 to be monitored and controlled thereby.

The process tube 12 is evacuated to a subatmospheric pressure, typically 500 millitorr or less, through a vacuum line 110 which is connected to a rear wall 112 at the source end 12a of the process tube 12. A pressure sensor 114 is connected to the vacuum line 110 and controls a gate valve 116 connected thereto in order to regulate the internal pressure of the process tube 12. A half gate valve 118 is connected in parallel with the gate valve 116. A vacuum pump 120 draws the gases through line 110 past pressure sensor 114 and through valves 116 and 118 where the gases are subsequently exhausted through a pump exhaust 122.

Figure 2:
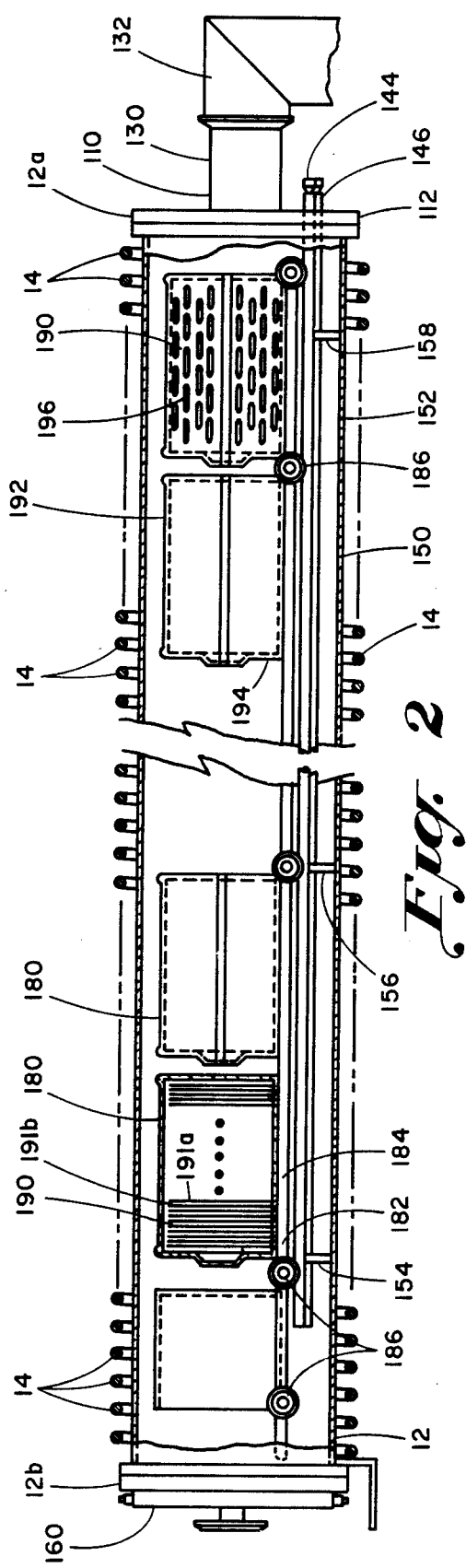
FIG. 2 is a side elevational view of a quartz process tube having portions removed to show the details of the location of a plurality of reactant gas injectors and a plurality of shrouded quartz boats with silicon wafers contained therein.
Figure 4:
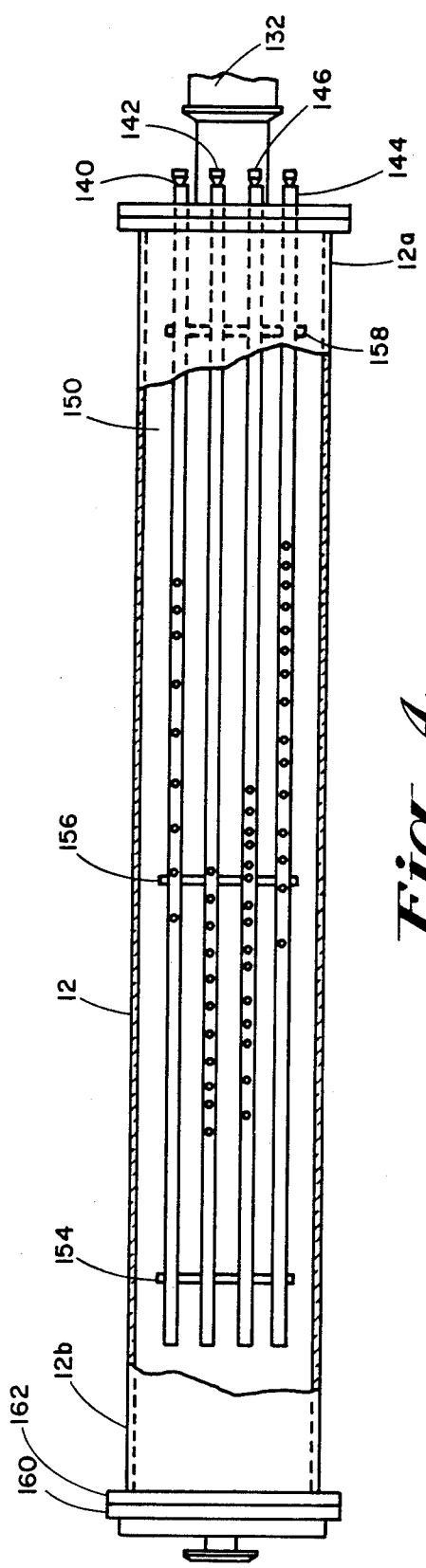
FIG. 4 is a top elevational view of the quartz process tube of FIG. 2 having portions broken away to show details of the orientation of the injectors within the process tube and a plurality of injector apertures formed therein.

Referring now to FIG. 2, the process tube 12 consists of a generally cylindrical, elongated quartz process tube of conventional type used in chemical vapor deposition processes and having a vacuum coupling 130, which comprises part of the vacuum line 110, connected to an elbow 132 at the rear wall 112 of the process tube 12. The process tube 12 also includes a plurality of injector tubes which are comprised of a silane load injector tube 140, a silane source injector tube 142, an oxygen load injector tube 144 and an oxygen source injector tube 146. The silane-phosphine load feed line 82 is connected to the load silane injector tube 140. The silane-phosphine source feed line 86 is connected to the silane source injector tube 142. The oxygen load feed line 36 is connected to the oxygen load injector tube 144. The oxygen source feed line 54 is connected to the oxygen source injector tube 146. The injector tubes are arranged along a bottom portion 150 of the process tube and are held spaced away from a wall 152 of the process tube by a plurality of injector supports, respectively numbered 154, 156 and 158 and enter the process tube 12 through the rear wall 112. The process tube 12 also includes a front closure door 160, located at the load end 12b, which seals against a front fitting 162. The front closure door 160 is adapted to be opened and closed to receive silicon wafers to be treated.

Figure 3:
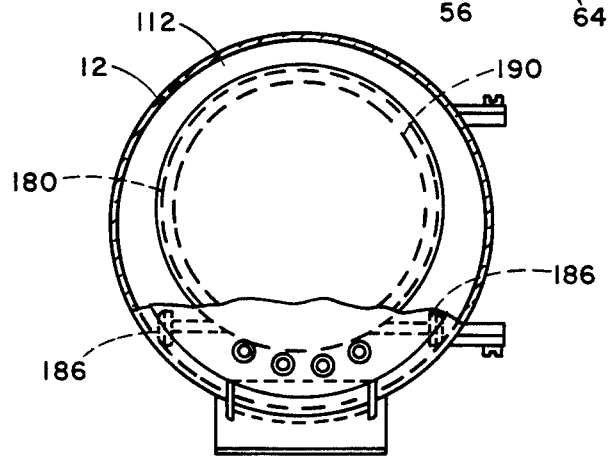
FIG. 3 is an end view of the quartz process tube of FIG. 2, having portions broken away to show details of the locations of the injectors within the process tube.

Referring now to FIGS. 2 and 3, FIG. 2 shows a plurality of shrouded boats 180, each having a plurality of openings 181 which comprise one-quarter of the surface area of the exterior surfaces of the boats 180, and which are supported upon a paddle 182 comprised of a pair of rails, one of which is shown as 184. The rails are supported in the process tube 12 by a plurality of wheels 186. Each of the boats 180 is adapted to receive and support therein a plurality of silicon wafers 190 having respective parallel surfaces 191a and 191b which are adapted to be treated within the process tube 12. The silicon wafers 190 are arranged within the boats 180 in a substantially perpendicular orientation with respect to a long axis of symmetry of the process tube 12 and are oriented parallel to one another. In addition, the boat 180 comprises a top portion 192 and a bottom portion 194, each of the portions having a plurality of staggered, elongated apertures 196 formed therein which are adapted to provide even concentrations of reactant gases within the boat so that coatings of borophosphosilicate glass deposited upon the surfaces of the silicon wafers 190 are uniform. The apertures 196 can comprise from fifteen percent (15%) to fifty percent (50%) of the total surface of the boat 180 and in the preferred embodiment comprise about twenty-five percent (25%) of the total surface area of the boats 180. A baffle 198 is located between the door 160 and the end boat 180 to insure a uniform flow of gas within the process tube 12 in order to promote a uniform rate of deposition of borophosphosilicate glass on the wafers 190.

The process of the instant invention is carried out by loading four or five boats of silicon wafers 190 onto the paddle 186 and inserting the paddle 186 into the process tube 12 through the front door 160 of the process tube. The silicon wafers 190 in each boat 180 are spaced 5 to 15 millimeters apart. If spaced less than 5 millimeters apart, the deposited borophosphosilicate glass film becomes nonuniform in thickness.

The half gate valve 118, which has a relatively large pressure drop across it, is then opened while the vacuum pump 120 is operating to allow the vacuum pump 120 to gradually draw down the pressure within the process tube 12. This is done in order that the boats 180, the silicon wafers 190 and other materials within the process tube 12 are not damaged by a rapid pressure drop which could cause loose objects to move around. In addition, the slow pressure reduction within the process tube 12 is carried out through gate valve 118 in order to prevent any particulates within the process tube 12 from being carried onto the wafers 190 by drafts created as the process tube 12 is pumped down. The half gate valve 118 remains open for about 1 minute and reduces the pressure within the process tube 12 to about 10 torr. The half gate valve 118 is then closed and the gate valve 116 is opened allowing the vacuum pump 120 to further reduce the pressure within the process tube 12 to about 15 millitorr in 3 minutes. At this point, the low flow rate nitrogen valve 30 is opened to flush out the process tube 12 while the process tube 12 is heating and bringing the silicon wafers 190 up to processing temperature. While the low flow rate nitrogen is flowing through the low flow rate nitrogen needle valve 28 and low flow rate nitrogen valve 30 the internal pressure in the process tube rises to approximately 300 millitorr. Once the process tube 12 reaches the deposition temperature, the low flow rate nitrogen valve 30 is closed and the oxygen valves 48 and 50 are opened allowing the process tube 12 to fill with oxygen. About 10 seconds later, while the oxygen mass flow controllers are ramping up to their set points under control of the microcomputer 109, the silane-phosphine and boron trichloride valves 62, 70, 80, 84, 100 and 102 are all opened to allow a mixture of silane, phosphine and boron trichloride to begin flowing into the process tube 12 through the load and source silane, phosphine injectors 140 and 142. The silane-phosphine and boron trichloride mass flow controllers 68, 74, 76, 94 and 96 are ramped up simultaneously during this period. The oxygen flow is turned on first in order to prevent unreacted silane from being drawn into the vacuum pump 120 which could lead to an explosion.

After a sufficient thickness of borophosphosilicate glass has been built upon the silicon wafers, the valves 62, 70, 80, 84, 100 and 102 are turned off to interrupt the flow of silane, phosphine and boron trichloride. Approximately one-half minute later, the valve 48 and 52 are turned off to interrupt the flow of oxygen, thus insuring that all silane is oxidized and no raw silane is carried through the vacuum pump 120.

At this point the low flow rate nitrogen valve 30 is opened to flush out the process tube 12 at approximately 300 millitorr pressure for 1 minute. The process tube 12 is then pumped down to 15 millitorr by the vacuum pump 120. Next, the high flow rate nitrogen valve 34 is opened while both of the gate valves 116 and 118 are closed. The process tube 12 fills to atmospheric pressure with high flow rate nitrogen in about 5 to 10 minutes.

It may be appreciated that the low flow rate needle valve 28 and the high flow rate needle valve 32 are each calibrated on a one time basis prior to any processes being run. The needle valve 28 is set by measuring the flow rate required to maintain the process tube at 300 millitorr nitrogen pressure while the vacuum pump 120 is operating and the gate valve 116 is opened. The high flow rate nitrogen valve is set by establishing a flow rate of nitrogen which will fill the process tube 12 to atmospheric pressure within 5 to 10 minutes starting from a pressure of 15 millitorr.

The flow rate of the silane through the mass flow meter 60 and the oxygen through both of the mass flow controllers 46 and 50 is adjusted so that the total flow rate of oxygen is one and one-half times the total flow rate of silane in the preferred embodiment of the process although one skilled in the art may select flow rates of oxygen to silane ranging form 1.3 to 1.8. The flow rates of the phosphine and boron trichloride are adjusted to select the total amount of phosphorus and boron to be included within the borophosphosilicate glass to be deposited upon the silicon wafers 190. In the instant embodiment, the boron trichloride flow rate was varied from 3.9 to 10.5 standard cubic centimeters per minute to yield boron concentrations within borophosphosilicate glass films on the silicon wafers 190 of 1.6 to 5.1 percent by weight. The phosphine flow rate was varied from 16.0 to 47.0 standard cubic centimeters per minute to yield phosphorus concentrations within the borophosphosilicate glass deposited upon the silicon wafers 190 of 1.6 percent to 6.0 percent by weight. Typically, in the instant process the oxygen flow rates ranged from 75 standard cubic centimeters per minute to 150 standard cubic centimeters per minute, while the silane flow rates ranged from 40 standard cubic centimeters per minute to 120 standard cubic centimeters per minute. Although silane and oxygen were used as source gases in the instant process, tetraethylorthosilicate could be substituted in their stead. Although phosphine was employed as a source of phosphorus, phosphorus oxychloride ($POCl_3$) can be substituted in its stead. Although boron trichloride has been employed as a source of boron, other boron halides such as boron tribromide ($BBr_3$) can be substituted in its stead.

Each of the flow rates of the reactant gases is accurately controlled by conventional, commercially available mass flow controllers, such as those from Tylan Corporation, in a manner well known in the art. The mass flow controllers 94 and 96 control the flow rates of the boron trichloride. The mass flow controllers 74 and 76 control the flow rates of the silane-phosphine mixture. The mass flow controllers 46 and 50 control the flow rates of the oxygen.

It may be appreciated that one of the advantages of the instant system is that the silane, phosphine and boron trichloride gas are premixed and delivered to the process tube 12 through the load and source silane injectors 140 and 142 without being able to react with the oxygen delivered through the oxygen load and source injectors 144 and 146 until the gases are intermixed within the process tube 12. This prevents preliminary unwanted deposition within the delivery lines and within the injectors which can generate particulates.

Another advantage of the instant apparatus and process lies in the fact that boron trichloride is used as the source of the boron included within the borophosphosilicate glass. Applicants have found that the boron source of choice, diborane $B_2H_6$) pyrolyzed within the silane injectors 140 and 142 and deposited boron therein, thereby preventing the boron from being included in the deposited glass coating upon the wafers. Applicants have discovered that contrary to the teachings of the prior art which would lead one to use diborane in a process for the deposition of borophosphosilicate glass, boron trichloride must be used as the source gas to obtain adequate inclusions of boron within the borophosphosilicate glass coatings being formed on the wafers.

Another advantage of the instant invention lies in the fact that the boron will not be preliminarily deposited within the injectors, thereby leading to clogging of the injectors with boron compounds.

The foregoing description of a preferred embodiment of the invention provides a significantly improved process for the low pressure chemical vapor deposition of borophosphosilicate glass on silicon wafers.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

What is claimed as new and desired to be secured by Letters Patent of the United States is:

1. A process for the chemical vapor deposition at low pressure of borophosphosilicate glass on a silicon wafer comprising the steps of: placing a silicon wafer to be treated in a process chamber; reducing a pressure within said process chamber to a subatmospheric pressure; heating said silicon wafer; contacting said silicon wafer with a mixture of gaseous compounds containing silicon, oxygen and phosphorus; contacting said silicon wafer with a boron halide gas; and reacting said silicon, oxygen, phosphorus gaseous compounds and said boron halide gas to form a layer of borophosphosilicate glass upon a surface of said silicon wafer.

2. A process for the chemical vapor deposition at low pressure of borophosphosilicate glass on a silicon wafer as defined in claim 1 wherein said pressure within said process chamber is less than or equal to 500 millitorr.

3. A process for the chemical vapor deposition at low pressure of borophosphosilicate glass on a silicon wafer as defined in claim 1 wherein said pressure within said process chamber is between 175 millitorr and 225 millitorr.

4. A process for the chemical vapor deposition at low pressure of borophosphosilicate glass on a silicon wafer as defined in claim 1 wherein said pressure within said process chamber is between 175 millitorr and 200 millitorr.

5. A process for the chemical vapor deposition at low pressure of borophosphosilicate glass on a silicon wafer as defined in claim 1 wherein said silicon wafer is heated to a temperature between 350° C. and 500° C.

6. A process for the chemical vapor deposition at low pressure of borophosphosilicate glass on a silicon wafer as defined in claim 1 wherein said silicon wafer is heated to a temperature of about 425° C.

7. A process for the chemical vapor deposition at low pressure of borophosphosilicate glass on a silicon wafer as defined in claim 1 wherein said boron halide gas comprises boron trichloride gas.

8. A process for the chemical vapor deposition at low pressure of borophosphosilicate glass on a silicon wafer as defined in claim 7 wherein said pressure of said process chamber is between 175 millitorr and 200 millitorr.

9. A process for the chemical vapor deposition at low pressure of borophosphosilicate glass on a silicon wafer as defined in claim 8 wherein said silicon wafer is heated to a temperature between 350° C. and 500° C.

10. A process for the chemical vapor deposition at low pressure of borophosphosilicate glass on a silicon wafer as defined in claim 8 wherein said silicon wafer is heated to a temperature of about 425° C.

11. A process for the chemical vapor deposition at low pressure of borophosphosilicate glass on a silicon wafer as defined in claim 10 wherein said mixture of gaseous compounds of silicon, oxygen and phosphorus comprise silane, oxygen and phosphine.

12. A process for the chemical vapor deposition at low pressure of borophosphosilicate glass on a silicon wafer comprising the steps of: inserting a silicon wafer to be treated into an elongated, cylindrical process tube; establishing an internal pressure within said elongated cylindrical process tube between 175 millitorr and 200 millitorr; heating said elongated cylindrical process tube to about 425° Centigrade; providing a gaseous source of silicon, oxygen, and phosphorus, to said elongated cylindrical process tube; contacting said silicon wafer within said tube with a boron halide gas; and terminating said flow of said gases when a desired thickness of borophosphosilicate glass has been deposited upon said plurality of silicon wafer.

13. A process for the chemical vapor deposition at low pressure of borophosphosilicate glass on a silicon wafer comprising the steps of: placing a silicon wafer within a deposition tube; establishing a pressure within said deposition tube of between 175 millitorr and 225 millitorr; heating said silicon wafer to between 350° C. and 500° C.; flowing a silicon source gas into said deposition tube; flowing a phosphorus source gas into said deposition tube; flowing a boron halide source gas into said deposition tube; flowing oxygen gas into said deposition tube; discontinuing the flow of said silicon source gas, said phosphorus source gas, said boron halide gas and said oxygen gas after a predetermined thickness of borophosphosilicate glass has been deposited from said gases on said silicon wafer; raising the internal pressure of said deposition tube to atmospheric pressure; and removing said silicon wafer from said deposition tube.

14. A process for the chemical vapor deposition at low pressure of borophosphosilicate glass on a plurality of silicon wafers comprising the steps of: placing a plurality of silicon wafers in a shrouded boat having a plurality of apertures formed therein which are adapted to admit process gases, said silicon wafers being oriented substantially parallel to each other and each said silicon wafer being separated from its nearest neighbor within said shrouded boat by a distance of not less than 5 millimeters and not greater than 15 millimeters; inserting said shrouded boat containing said silicon wafers into an elongated, cylindrical quartz process tube having an elongated axis of symmetry, said silicon wafers being positioned substantially perpendicular to said elongated axis of symmetry; reducing an internal pressure within said elongated, cylindrical process tube to a pressure of between 175 millitorr and 200 millitorr; heating said elongated, cylindrical process tube to an internal temperature of about 425° C.; flowing a quantity of silane gas at a first flow rate into a silane delivery line; flowing a quantity of phosphine gas at a second flow rate into a phosphine delivery line; flowing a quantity of boron trichloride gas at a third flow rate into a boron trichloride delivery line; receiving said quantities of silane gas, phosphine gas and boron trichloride gas in a reactant mixing line wherein the silane gas, the phosphine gas and the boron trichloride gas are mixed to form a mixture of reactant gases; flowing said mixture of reactant gases into an elongated tubular reactant gas injector located within said elongated, cylindrical process tube; flowing said gas mixture of reactant gases out of said reactant gas injector and into the vicinity of said plurality of silicon wafers located within said process tube; flowing a quantity of oxygen gas into an oxygen delivery line at a fourth flow rate substantially equal to 1.5 times said first flow rate; flowing said oxygen gas out of said oxygen delivery line through an elongated tubular oxygen injector located within said elongated process tube and into the vicinity of said plurality of silicon wafers; mixing said oxygen gas with said gas mixture of silane gas, phosphine gas and boron trichloride gas to effect a reaction therebetween; forming a layer of borophosphosilicate glass on a surface of each of said silicon wafers as a result of said reaction between said quantities of silane gas, phosphine gas, boron trichloride, gas and oxygen gas; and removing said shrouded boat containing said plurality of silicon wafers from said elongated, cylindrical process tube.

* * * * *